US008876971B2

(12) United States Patent
Curtis et al.

(10) Patent No.: US 8,876,971 B2
(45) Date of Patent: *Nov. 4, 2014

(54) PRECURSORS FOR FORMATION OF COPPER SELENIDE, INDIUM SELENIDE, COPPER INDIUM DISELENIDE, AND/OR COPPER INDIUM GALLIUM DISELENIDE FILMS

(75) Inventors: Calvin J. Curtis, Lakewood, CO (US); Alexander Miedaner, Boulder, CO (US); Maikel Van Hest, Lakewood, CO (US); David S. Ginley, Evergreen, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 1440 days.

This patent is subject to a terminal disclaimer.

(21) Appl. No.: 11/813,234

(22) PCT Filed: Nov. 9, 2006

(86) PCT No.: PCT/US2006/060757
§ 371 (c)(1),
(2), (4) Date: Jul. 15, 2009

(87) PCT Pub. No.: WO2008/063190
PCT Pub. Date: May 29, 2008

(65) Prior Publication Data
US 2009/0280624 A1 Nov. 12, 2009

(51) Int. Cl.
*C30B 9/02* (2006.01)
*C23C 18/12* (2006.01)
*H01L 31/032* (2006.01)

(52) U.S. Cl.
CPC ........ *H01L 31/0322* (2013.01); *C23C 18/1204* (2013.01); *Y02E 10/541* (2013.01)

USPC .................. 117/68; 117/70; 117/73; 117/86

(58) Field of Classification Search
USPC .......................................... 117/68, 70, 73, 86
See application file for complete search history.

(56) References Cited

U.S. PATENT DOCUMENTS

| 5,441,897 A | 8/1995 | Noufi et al. |
| 5,628,817 A | 5/1997 | Fugleberg et al. |
| 6,127,202 A | 10/2000 | Kapur et al. |

(Continued)

FOREIGN PATENT DOCUMENTS

| JP | 2003282600 | 10/2003 |
| KR | 1020020007777 | 1/2002 |

OTHER PUBLICATIONS

Kerr et al., "Rapid Thermal Processing of CIS Precursors", IEEE, 2002.

(Continued)

*Primary Examiner* — Bob M Kunemund
(74) *Attorney, Agent, or Firm* — John C. Stolpa; Michael A. McIntyre (57) ABSTRACT

Liquid-based precursors for formation of Copper Selenide, Indium Selenide, Copper Indium Diselenide, and/or copper Indium Galium Diselenide include copper-organoselenides, particulate copper selenide suspensions, copper selenide ethylene diamine in liquid solvent, nanoparticulate indium selenide suspensions, and indium selenide ethylene diamine coordination compounds in solvent. These liquid-based precursors can be deposited in liquid form onto substrates and treated by rapid thermal processing to form crystalline copper selenide and indium selenide films.

62 Claims, 4 Drawing Sheets

(56) References Cited

U.S. PATENT DOCUMENTS

| | | | |
|---|---|---|---|
| 6,368,892 B1 | 4/2002 | Arya | |
| 6,599,378 B1 | 7/2003 | Hagiwara et al. | |
| 6,736,986 B2 | 5/2004 | Stanbery | |
| 6,830,778 B1 | 12/2004 | Schulz et al. | |
| 8,057,850 B2 * | 11/2011 | Curtis et al. | 427/74 |
| 2004/0219730 A1 | 11/2004 | Basol | |
| 2004/0261841 A1 | 12/2004 | Negami et al. | |
| 2005/0009225 A1 | 1/2005 | Mitzi et al. | |
| 2005/0028861 A1 | 2/2005 | Aoki et al. | |
| 2005/0158909 A1 | 7/2005 | Milliron et al. | |
| 2005/0183767 A1 | 8/2005 | Yu et al. | |
| 2005/0186342 A1 | 8/2005 | Sager et al. | |
| 2011/0189080 A1 * | 8/2011 | Curtis et al. | 423/509 |

OTHER PUBLICATIONS

Dhere, et al "Low Toxic Processing of Thin and Ultra-Thin CIGSS Absorber Solar Cells", Florida Solar Energy Center, University of Central Florida.

Schulz et al., "CIGS films by Nanoparticle Spray Deposition: Attempts at Densifying a Porous Precursor", Electronic Materials, 1998.

NREL Disclosure Project Title: "Inkjet Direct Write Solar Cells", 2005.

European Search Report dated Feb. 2, 2012 for EU Appl. No. 06846272.0 corresponding to U.S. Appl. No. 11/813,234.

PCT International Search Report and Written Opinion dated Aug. 8, 2008 for PCT Appl. No. PCT/US2006/060757 corresponding to U.S. Appl. No. 11/813,234.

PCT06-15 IPRP & ISR for May 22, 2009 for International App. PCT/US06/60756.

Kapur et al., "Lab to Large Scale Transition for Non-Vacuum Thin Film CIGS Solar Cells," NREL/SR-520-37284 (2005).

Stanbery et al., "Reaction Engineering and Precursor Film Deposition for CIS Synthesis," Department of Chemical Engineering, U of FL.

Kapur et al, "Non-Vacuum Processing of $CuIn_{1-x}Ga_x Se_2$ Solar Cells on Rigid and Flexible Substrates using Nanoparticle Precursor Inks," Thin Solid Films, 431-432, pp. 53-57 (2003).

* cited by examiner

PRECURSORS FOR FORMATION OF COPPER SELENIDE, INDIUM SELENIDE, COPPER INDIUM DISELENIDE, AND/OR COPPER INDIUM GALLIUM DISELENIDE FILMS

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

BACKGROUND

Group IB-IIIA-VIA compounds, especially copper indium diselenide (CIS) and copper indium gallium diselenide (CIGS) compounds, are promising and much studied semiconductor materials for a number of thin-film semiconductor applications, not the least of which include absorber layers for solar cells, because the elements themselves are common and fairly inexpensive, and significant solar to electrical energy conversion efficiencies with CIS and CIGS absorber layers have been demonstrated. However, techniques for inexpensive production of consistently high quality Group IB-IIIA-VIA thin film semiconductor compounds needed for large scale commercial acceptance and applications have been elusive.

In general, the stoichiometry of Group IB-IIIA-VIA compounds that have exhibited the highest solar to electrical energy conversion efficiencies have been slightly poor, or at least not rich, in the Group IB component in relation to the Group IIIA component(s), which is sometimes called the I/III ratio. For example, in Group IB-IIIA-VIA compounds in which the Group IB component is copper, I/III ratios in a range of about 0.8 to 1.0 have demonstrated the best solar to electrical conversion efficiencies. When the I/III ratio exceeds 1.0, the Group IB-III-VIA compounds become unstable and Group IB-VIA phases tend to form, which deteriorates the electrical characteristics of the material and adversely affects the solar energy conversion efficiency. Also, in general, the larger the crystal grains of the Group IB-IIIA-VIA compounds, the better the electrical characteristics, which are directly related to the solar to electrical energy conversion efficiencies.

Unfortunately, such compositional control and uniformity with large grain polycrystalline film formation of Group IB-IIIA-VIA compounds over large substrate surface areas has not been easy to achieve. Most current CIS and CIGS production methods involve some kind of vacuum deposition technology, for example, physical vapor deposition, which typically has high capital costs as well as high production costs. Therefore, there has been a long-time need for less expensive alternatives for producing consistent, high quality, crystalline or polycrystalline thin films of Group IB-IIIA-VIA compounds. In this regard, various combinations of thin films of CuSe, $Cu_2Se$, InSe, and $In_2Se_3$ are increasingly being studied for use as precursors to achieve the production of large-grained $CuInSe_2$ films for solar cells. An emerging goal is to develop less costly, reproducible processes for making consistent, large-area, high quality CIS and/or CIGS absorber layers that do not involve vacuum deposition technologies. In this quest, thin films of CuSe, $Cu_2Se$, InSe, and $In_2Se_3$ that are not made with vacuum deposition technologies would be employed as precursors for the production of CIS and CIGS films for solar cells. These films are also being examined for use in thin film tandem cells and as channel layers in high performance transistors.

The foregoing examples and descriptions of the related art are intended to be generally illustrative and not exclusive. Other examples and limitations of the related an are known to persons skilled in the art or will become apparent to persons skilled in the art upon a reading of the specification and a study of the drawings.

BRIEF DESCRIPTION OF THE DRAWINGS

Example embodiments or features of example embodiments are illustrated in referenced figures of the drawings. It is intended that the embodiments and characteristics disclosed herein are to be considered illustrative and not exclusive or limiting. Therefore, in the drawings.

DETAILED DESCRIPTION OF EXAMPLE IMPLEMENTATIONS

As explained above, thin films of CuSe, $Cu_2Se$, InSe, and $In_2Se_3$ are being studied for use as precursors for production of CIS and CIGS films without having to use vacuum deposition technologies. Also, it is advantageous to develop liquid-based precursors for Cu—Se, In—Se, CIS, and/or CIGS films for a number of reasons, including, but not limited to, the ease and variety of deposition techniques that can be used to deposit the precursor materials on substrates or other surfaces. Such deposition techniques may include, for example, but not for limitation, drop coating, dip coating, spin coating, spraying, brushing, air brushing, ink jet application, stamping, printing, pouring, wiping, smearing, or other methods of applying a liquid film on a surface. Some of the precursors described herein are soluble in solvents and, when dissolved, are in solutions, whereas others are mixtures or suspensions of the precursors in liquids. Therefore, for convenience and to avoid unduly restrictive constructions of terms and descriptions used herein, any precursor in a liquid solution, mixture, suspension, paste, or other form that can be handled and deposited on a surface with a technique or equipment that is usable for liquids, including, but not limited to, those mentioned above, may be referred to interchangeably as liquid, liquid-based, solution, or solution-based precursor. Also, the terms deposited, dispersed, spread, applied, and other terms may be used interchangeably when referring to the placement of the liquids comprising one or more of the precursors on a substrate or other surface on which In—Se, Cu—Se, CIS, and/or CIGS is to be formed front the precursor, and the use of any one or more of such terms should not be construed as precluding or as not including such placement of the liquids in a manner that could be described by another one of such terms.

Example liquid-based or solution-based precursors described below for depositions of such CuSe, Cu$_2$Se, InSe, In$_2$Se$_3$, CIS, or CIGS films at atmospheric pressure are particularly desirable because of their simplicity, stability in air, and low cost. Examples of the resulting Cu—Se films and In—Se films have been shown to have good crystallinity, and such films or precursors for such films can be used as precursors for the production of CIS and CIGS films for solar cells and other applications. The Cu—Se notation used herein is generally used to refer genetically to any compound of copper and selenium (for example CuSe, Cu$_2$Se, and others) and the In—Se notation used herein is generally used to refer genetically to any compound of indium and selenium (for example InSe, In$_2$Se$_3$ and others). Also, CIS and CIGS can be represented by the general chemical formula of CuIn$_{1-x}$Ga$_x$Se$_2$, where $0 \leq x \leq 1$, or more simply as Cu(In,Ga)Se$_2$. Any or all of these abbreviations, chemical notations, and chemical formulae conventions may be used in this description. Also, when this description mentions copper-indium-selenide, copper indium diselenide, CIS, or CuInSe$_2$ in discussing applications for the example precursors described herein, persons skilled in the art will recognize that such materials are also applicable to production of other Cu(In$_x$Ga)Se$_2$ compounds and are not intended to be limited to CuInSe$_2$.

The first example liquid-based Cu$_2$Se precursor described herein is prepared as shown, for example, by the following chemical equation:

where Se is elemental selenium and n-BuLi is n-butyl lithium, which is a very reactive organolithium reagent that reacts with the selenium to form lithium n-butyl selenide (n-BuSeLi). The copper is introduced as a copper(I) salt, such as the copper acetonitrile Cu(CH$_3$CN)$_4^{4+}$ in equation (1), which reacts with the n-butyl selenide to form copper n-butyl selenide [n-BuSeCu]$_x$, where the subscripted x is used to denote that the [n-BuSeCu] units associate to form oligomers. The copper n-butyl selenide precipitates from the reaction mixture and is formulated as an oligomer of [n-BuSeCu] monomers. The [n-BuSeCu]$_x$ is then suspended in dimethyl sulfoxide (DMSO), which is a solvent, and ethanolamine, which functions as a dispersant for the [n-BuSeCu]$_x$ particles. This liquid suspension of the [n-BuSeCu]$_x$ is stable at room temperature and can be stored for long periods of time without deterioration, and it is stable enough to be deposited on a substrate or other surface by one or more of the techniques listed above, so it is considered to be a liquid-based precursor in this description.

Figure 1:
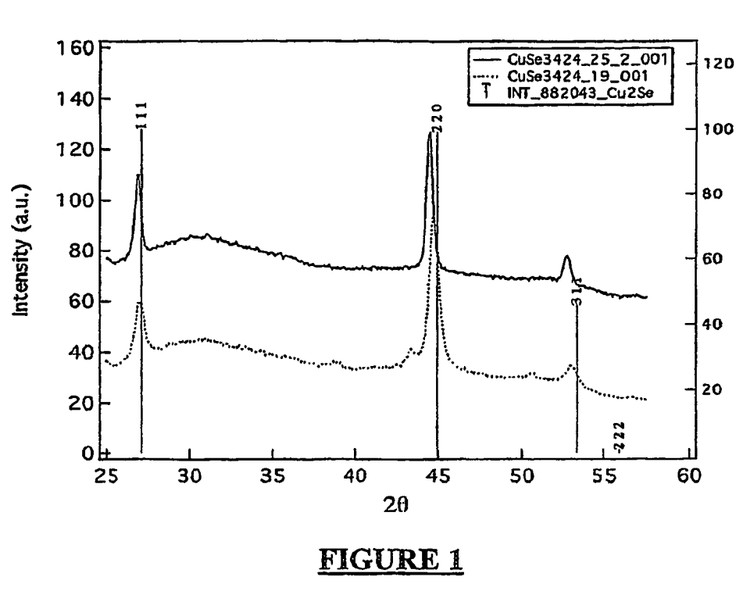
FIG. 1 shows X-ray diffraction (XRD) patterns of example $Cu_2Se$ films obtained from $[n-BuSeCu]_x$ (top trace) and $Cu_2Se_x(en)_y$ (bottom trace) after annealing at 350° C. in argon.

To test the [n-BuSeCu]$_x$ suspension for use in forming films of Cu2Se, it was drop-coated onto glass substrates and annealed at 350° C. in an argon atmosphere. The [n-BuSeCu]$_x$ precursor decomposed, and the organic components vaporized leaving a film of crystalline Cu$_2$Se, as shown by the X-ray diffraction (XRD) scan in FIG. 1. Therefore, this resulting crystalline Cu$_2$Se film is a good candidate precursor for forming CIS and/or CIGS semiconductor materials for solar cell absorber layers or for other uses, and the copper n-butyl selenide suspension described above is a good liquid-based precursor for making the crystalline Cu$_2$Se film.

EXAMPLE I

A suspension of Se (0.79 g, 0.01 mole) in THF (50 mL) under nitrogen was treated with n-butyl lithium solution (4.0 mL of 2.5 M solution in hexanes, 0.01 mole). After stirring for 15 minutes, the Se dissolved completely to give a yellow solution of lithium n-butyl selenide. The lithium n-butyl selenide solution was then added to a solution of [Cu(CH$_3$CN)$_4$](PF$_6$) (3.73 g, 0.01 mole) in CH$_3$CN (50 mL), and a dark brown precipitate formed. This precipitated [n-BuSeCu]$_x$ was separated from the solution by centrifugation, washed with fresh THF (40 mL) and dried in a stream of N$_2$. A suspension of 0.10 g of this material in 5 mL DMSO plus 0.5 mL ethanolamine or 3.0 mL ethylene diamine was used for the depositions described. The suspension in DMSO/ethanolamine was drop coated onto a microscope slide and the resulting film was annealed at 350° C. in Ar to yield the crystalline Cu$_2$Se film characterized in FIG. 1.

While the example described above has been shown to work well for making the copper n-butyl selenide precursor for the crystalline Cu$_2$Se films, persons skilled in the art will recognize, after becoming familiar with the example, that other reagents with similar characteristics can be substituted for those used in the examples to get similar, if not even better, results. For example, there are a number of organolithium reagents that are reactive enough to react with the elemental selenium to provide alkyl or aryl selenium reagents to react with the copper salt, such as, but not limited to, t-butyl lithium, sec-butyl lithium, methyl lithium, phenyl lithium, tolyl lithium, xylyl lithium, and 2,6-diisopropylphenyl lithium. Also, the copper salt can be another organic copper salt, for example, copper(I) methoxide (CuOCH$_3$), or it can be an inorganic copper salt, for example, a copper halide, such as copper iodide (CuI), copper bromide, copper chloride, or any other copper(I) salt that reacts with the organoselenide reagents to precipitate copper-organoselenide monomers or oligomers that can be suspended and dispersed in a liquid for drop, spin, spray, or other deposition on a substrate, which upon heating to a temperature sufficient to decompose the copper-organoselenide precursor and drive off the organic residues, forms a crystalline Cu$_2$Se film. Also, instead of DMSO, other solvents that can be used to disperse the copper-organoselenide precursor in the general method described above, for example, ethylene diamine. Also, ethanolamine, other secondary and tertiary amines can be used as complexing agents in order to form a liquid-based Cu$_2$Se precursor that can be processed as described above to form a crystalline Cu$_2$Se film.

EXAMPLE II

A particulate Cu$_2$Se precursor was also prepared. An aqueous solution of NaHSe was prepared by the reaction of Se (0.20 g, 0.0025 mole) in 10 mL H$_2$O with NaBH$_4$ (0.19 g, 0.005 mole) at 0° C. for 1 h. This solution was then added slowly over a period of 1 h to a solution of [Cu(CH$_3$CN)$_4$](PF$_6$) (1.86 g, 0.005 mole) in CH$_3$CN (50 mL) at room temperature. The resulting black precipitate was collected by filtration, washed with water (50 mL) and CH$_3$CN (50 mL) and dried in a stream of N$_2$. This material was suspended in methanol, drop coated onto a microscope slide, and the resulting film was annealed at 350° C. in Ar to yield a crystalline Cu$_2$Se film.

Another liquid or solution-based precursor for crystalline Cu$_2$Se films can be obtained by reacting commercial Cu$_2$Se powder with elemental selenium and ethylene diamine (sometimes called 1,2-diaminoethane or abbreviated "en") as shown by the equation:

where $Cu_2Se$ is the commercial copper selenide powder, Se is the elemental selenium, the $H_2N-(CH_2)_2-NH_2$ is the ethylene diamine, and $Cu_2Se_x(en)_y$ is the copper selenide ethylene diamine compound, sometimes referred to as the $Cu_2Se_x$-ethylene diamine coordination compound or just $Cu_2Se_x$-ethylene diamine for convenience. The $Cu_2Se_x(en)_y$ forms a red solution in ethylene diamine. In the $Cu_2Se_x(en)_y$ produced according to equation (2), $1 \le x \le 12$ and $y \ge 1$. The exact number of ethylene diamine molecules in the $Cu_2Se_x$-ethylene diamine coordination compound is not significant for the application of the $Cu_2Se_x$-ethylene diamine coordination compound as a liquid or solution-based precursor for crystalline $Cu_2Se$ as described herein, because any number of en's in the complex in this manner will be soluble at least in ethylene diamine. In an example analysis of $Cu_2Se_x(en)_y$ produced as described herein, x appeared to be 8, and y appeared to be 2. When the red solution of $Cu_2Se_x(en)_y$ in ethylene diamine produced from the synthesis in equation (2) was drop coated onto a glass substrate and annealed in argon at 350° C., the organic ligands were vaporized and driven out, Se was lost, and crystalline $Cu_2Se$ was formed in a crystalline thin film on the substrate, as shown by the X-ray diffraction pattern in FIG. 1. Therefore, the ethylene diamine solution of $Cu_2Se_x(en)_y$ is a viable liquid precursor for forming crystalline $Cu_2Se$, which in turn can be used as a precursor for forming CIS and/or CIGS semiconductor materials. This soluble red $Cu_2Se_x(en)_y$ precursor must be formed and stored under nitrogen or other oxygen-free condition to prevent oxidation of the copper, and it can be stored at room temperature. It can be deposited in air and survives deposition in air at 200° C. with no evidence of oxidation. It can also be diluted to any concentration desired for drop coating, dip coating, spin coating, spraying, ink jet application, or any other method of applying a uniform liquid film on a surface.

EXAMPLE III

A mixture of $Cu_2Se$ (2.06 g, 0.01 mole), Se (0.80 g, 0.01 mole), and ethylene diamine (30 mL) was sonicated under $N_2$ in a 600 W KONTES Sonicator for 6 hours to give a red solution comprising the $Cu_2Se_x(en)_y$ according to equation (2) as described above. This solution comprising the copper selenide ethylene diamine compound was filtered under $N_2$ to remove a small amount of solid and then used directly for depositions. The solution was drop coated onto a microscope slide, and the resulting film was annealed at 350° C. in Ar to yield the crystalline $Cu_2Se$ film characterized in FIG. 1.

While the example described above has been shown to work well for the $Cu_2Se_x(en)_y$ precursor for making $Cu_2Se$ films, persons skilled in the art will recognize, after becoming familiar with the example, that other reagents with similar characteristics can be substituted for the ethylene diamine used in the examples to get similar, if not even better, results. For example, the ethylene diamine is a di-functional basic ligand that forms a scaffold, which supports $Cu_2Se_x$ units in the 3-dimensional structure. Other such di-functional diamine ligands with similar characteristics can be used for this purpose instead of ethylene diamine, such as 1,3-diaminopropane, or 1,2-diaminobenzene. Also, a number of solvents other than ethylene diamine, such as, for example, DMSO or dimethyl formamide (DMF), can be used to dissolve the $Cu_2Se_x(en)_y$ precursor for application of the precursor to a substrate. Essentially, any solvent that can dissolve the $Cu_2Se_x(en)_y$ precursor can be used.

As mentioned above, $In_2Se_3$ can also be used as one of the precursors for making CIS and/or CIGS semiconductor materials. An example precursor for making such $In_2Se_3$ precursor material is a nanoparticle $In_2Se_3$ material, denoted nano-$In_2Se_3$, which can be made as shown by the following equation:

$$2InI_3 + 3Na_2Se \xrightarrow{MeOH} \text{nano-}In_2Se_3 + 6NaI \qquad (3)$$

Figure 2:
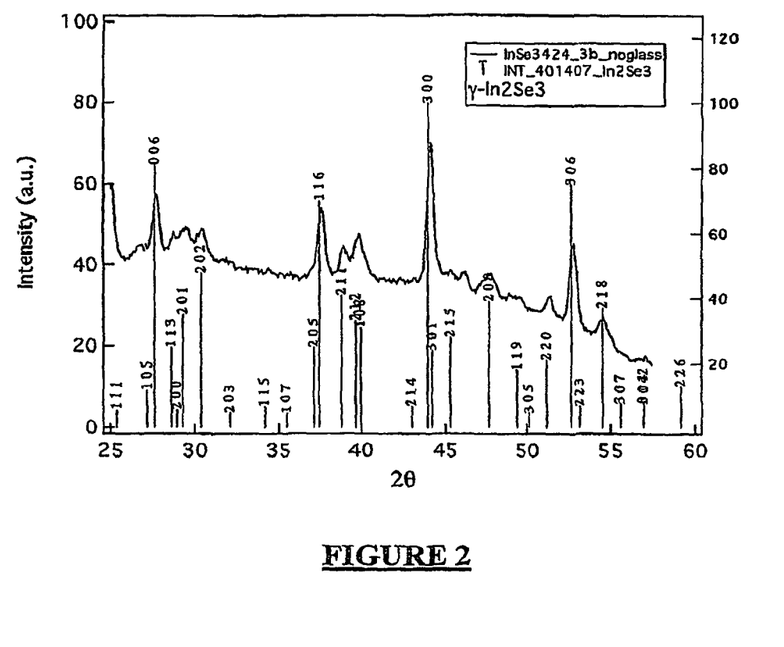
FIG. 2 shows an XRD scan of an example nanoparticle $In_2Se_3$ precursor annealed in a sealed tube at 350° C.

Essentially, indium iodide reacts with sodium selenide in methanol to form $In_2Se_3$ nanoparticles, i.e., particles less than 100 nanometers (nm) in diameter, which is also sometimes called nano-$In_2Se_3$ for convenience. When the NaI was washed away and these particles were annealed at 350° C. in a closed tube, crystalline $In_2Se_3$ was obtained, as shown by the X-ray diffraction scan in FIG. 2. This result demonstrates that the nanoparticle $In_2Se_3$ precursor can be processed to form large-grained crystalline material under mild conditions.

Figure 3:
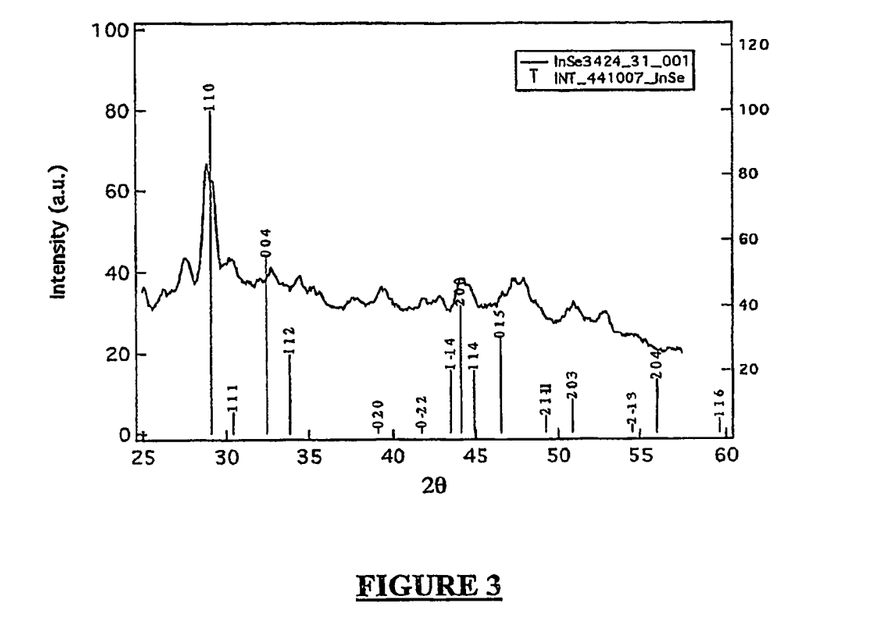
FIG. 3 shows an XRD scan of an example $In_2Se_3$ nanoparticle film annealed at 350° C. in flowing argon showing conversion to InSe.

On the other hand, when the nano-$In_2Se_3$ from equation (3) was deposited from a methanol slurry on glass, for example by drop coating the slurry onto a glass slide, and then annealed overnight (approximately twelve hours) at 350° C. in flowing argon, some Se was lost and a crystalline film of InSe was formed, as shown in FIG. 3. Crystalline InSe is a stoichiometric compound for which a standard XRD pattern is well known. FIG. 3 shows both the well-known standard XRD pattern for crystalline InSe and the XRD pattern for the material produced with this longer anneal time, which match and thereby show that the material was crystalline InSe.

However, when an identical precursor film was rapidly annealed at either 350° C. or 500° C. for five minutes, no selenium was lost and $\gamma$-$In_2Se_3$ was produced. Therefore, selenium loss can be mitigated by rapid thermal processing of the precursor films to produce $\gamma$-$In_2Se_3$ films starting from the nano-$In_2Se_3$ precursor instead of the crystalline InSe described above. The $\gamma$ (gamma) indicates the crystalline structure of the $In_2Se_3$ compound, as is understood by persons skilled in the art. Rapid thermal processing (RTP) is a way of annealing samples by heating rapidly to a desired temperature, maintaining that temperature for a short time, and then cooling, as is understood by persons skilled in the art. In this case, for example, but not for limitation, an optical RTP furnace was used. This furnace uses intense light coupled to a silicon or carbon susceptor to heat the sample, and it is capable of heating a sample from room temperature to 500° C. in about twenty seconds. The samples are typically maintained at the desired temperature for about two to eight minutes, although crystalline $In_2Se_3$ can be produced from these precursors by annealing in this manner for as much as fifteen minutes. When the light in the furnace is turned off, the sample also cools quickly because of the low thermal mass of the susceptor.

As mentioned above, either InSe or $In_2Se_3$ can also be used as a precursor for the formation of CIS and/or CIGS. Other forms of In—Se with the ratio of In to Se between that of InSe and $In_2Se_3$ can also be used as precursors for CIS and/or CIGS, and the nano-$In_2Se_3$ front equation (3) is a useful precursor for any of such crystalline In—Se compounds or films. In general, annealing the nano-$In_2Se_3$ from the slurry by RTP at any temperature in the range of 300 to 650° C. for a time in a range of two to fifteen minutes can be used to produce $\gamma$-$In_2Se_3$, whereas annealing in that temperature range for more than fifteen minutes will result in some loss of Se and the production of InSe. Example nano-$In_2Se_3$ precursors prepared according to equation (3), are explained in Examples IV and V below.

EXAMPLE IV

A solution of $InI_3$ (0.99 g, 0.002 mole) in methanol (150 mL) was cooled to −80° C., and a solution of $Na_3Se$ (0.38 g, 0.003 mole) in methanol (50 mL) was added rapidly. The product precipitated immediately to form a yellow suspension comprising $In_2Se_3$. The yellow $In_2Se_3$ product was collected by centrifugation and washed with three 50 mL portions of fresh methanol. As the NaI was removed, the nano-$In_2Se_3$ dispersed better in methanol, and not all the product resettled after the third wash. The material was not dried, but it was re-suspended in 30 mL of methanol, and this suspension was used for In—Se depositions.

Equation (3) is a precipitation reaction in which indium (III) iodide ($InI_3$) reacts with sodium selenide ($Na_2Se$) to form the desired indium selenide in nanoparticulate form and sodium iodide (NaI) as a byproduct. Methanol acts as the solvent for this reaction, and it was chosen because NaI remains soluble in methanol after the nano-$In_2Se_3$ precipitates, and it can be used to completely remove NaI from the product. This nano-$In_2Se_3$ precursor can be prepared easily in large amounts and stored for future use without noticeable degradation.

EXAMPLE V

In another example, selenium (0.79 g, 0.01 mole) was suspended in degassed water, cooled in an ice bath and treated with solid $NaBH_4$ (0.76 g, 0.02 mole) in small portions. After stirring for one hour, a clear solution of NaHSe formed. This solution was added to a solution of $InI_3$ (1.48 g, 0.0066 mole) in methanol (60 mL) and the yellow product comprising the nano-$In_2Se_3$ precipitated immediately. This precipitate was collected and washed as in Example IV above, and it was re-suspended for deposition.

Figure 4:
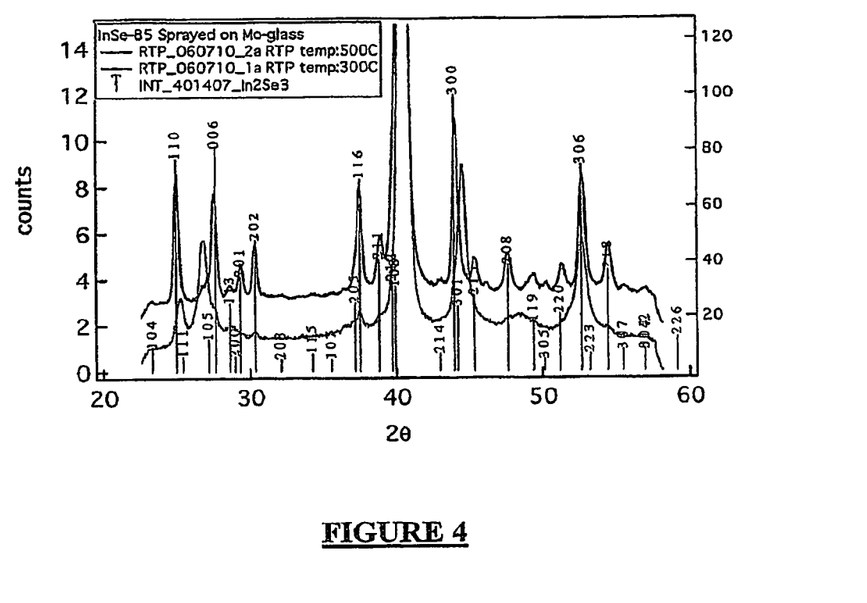
FIG. 4 shows XRD patterns for example indium selenide films made from the $In_2Se_4(enH_x)(N_2H_5)_{2-x}(en)_y(N_2H_4)_x$ precursor annealed at 300° C. and 500° C. showing conversion to a crystalline In—Se phase at the lower temperature and to crystalline $In_2Se_3$ at the higher temperature.

Another soluble precursor for crystalline In—Se films, which may be characterized by the general formula $In_2Se_4(enH)_x(N_2H_5)_{2-x}(en)_y(N_2H_4)_y$, and called $In_2Se_4$-ethylene diamine coordination compound, $In_2Se_4$-ethylene diamine complex, or just $In_2Se_4$-ethylene diamine for convenience, was prepared by reaction of commercial $In_2Se_3$, elemental Se, hydrazine, and ethylene diamine. The clear yellow solution that results from this reaction can be applied in liquid form onto glass or other suitable substrates by drop coating, dip coating, spin coating, spray, ink jet, or any other liquid application apparatus or method, which is a significant advantage. Decomposition of this precursor and film crystallization were studied using both conventional oven heating and rapid thermal processing (RTP). The $In_2Se_4(enH)_x(N_2H_5)_{2-x}(en)_y(N_2H_4)_x$ precursor solution was sprayed onto Mo-coated glass substrates and annealed by RTP at two different temperatures. The annealed films were characterized by XRD and the results are shown in FIG. 4. The lower trace in FIG. 4 shows the XRD pattern obtained for a sprayed film annealed at 300° C. for five minutes. It shows that a crystalline In—Se phase was produced. The upper trace in FIG. 4 shows the XRD pattern obtained from a similar sprayed $In_2Se_4(enH)_x(N_2H_5)_{2-x}(en)_y(N_2H_4)_x$ precursor film annealed at 500° C. for five minutes. A crystalline $\gamma$-$In_2Se_3$ film was obtained under these conditions. Therefore, this $In_2Se_4(enH)_x(N_2H_5)_{2-x}(en)_y(N_2H_4)_x$ is a versatile precursor that can be used to produce films of crystalline In—Se when annealed at 300-350° C., or to produce films of $\gamma$-$In_2Se_3$ when annealed at 400-500° C. Even higher annealing temperatures, e.g., 500 to 650° C., can be used to produce crystalline $\gamma$-$In_2Se_3$ from the $In_2Se_4(enH)_x(N_2H_5)_{2-x}(en)_y(N_2H_4)_x$ precursor if substrates that, can withstand those temperatures are used. Also, longer anneal time, i.e., longer than fifteen minutes, for example, but not for limitation, in a conventional oven or furnace, will result in loss of Se and thereby production of some form of crystalline In—Se other than $\gamma$-$In_2Se_3$.

Specific examples of the use of this $In_2Se_4(enH)_x(N_2H_5)_{2-x}(en)_y(N_2H_4)_x$ precursor for the preparation of crystalline In—Se and crystalline $In_2Se_3$ film by RTP are described below.

EXAMPLE VI

A mixture of $In_2Se_3$ (0.94 g. 0.002 mole), Se (0.16 g, 0.002 mole), ethylene diamine (5 mL) and anhydrous hydrazine (5 mL) was stirred for three days at room temperature. During this time, the solids dissolved and a clear yellow solution comprising the $In_2Se_4(enH)_x(N_2H_5)_{2-x}(en)_y(N_2H_4)_x$ precursor, i.e., $In_2Se_4$-ethylene diamine, was formed. This solution was then used directly for depositions of the In—Se films. When this $In_2Se_4(enH)_x(N_2H_5)_{2-x}(en)_y(N_2H_4)_x$ precursor solution was sprayed on Mo-glass substrates and then annealed at 300° C. for five minutes in argon, a crystalline In—Se film resulted. The XRD pattern presented in the lower trace in FIG. 4 indicates that this material is crystalline In—Se, as explained above. When a similar precursor film was annealed at 500° C. for five minutes in argon, the result was a crystalline $\gamma$-$In_2Se_3$ film, as shown by the upper trace in FIG. 4. The concentration of the $In_2Se_4(enH)_x(N_2H_5)_{2-x}(en)_y(N_2H_4)_x$ precursor was varied by using the same amounts of $In_2Se_3$ and Se with 7.5 and 10 mL portions of both ethylene diamine and hydrazine in subsequent preparations. The $In_2Se_4(enH)_x(N_2H_5)_{2-x}(en)_y(N_2H_4)_x$ precursor was also prepared in the same way using equal volumes of hydrazine hydrate and ethylene diamine with similar results.

Because the solution prepared for the reaction described above for producing the $In_2Se_4$-ethylene diamine, i.e., $In_2Se_4(enH)_x(N_2H_5)_{2-x}(en)_y(N_2H_4)_x$, precursor contains both ethylene diamine (en) and hydrazine ($N_2H_4$), and because both the en and $N_2H_4$ have comparable basicities, there are a number of specific formulation possibilities, one or more of which may be present in the solution. The possibilities all have an $In_2Se_4^{2-}$ core, but the ligands may include an all-en formula and/or mixed en/$N_2H_4$ structures, for example, $In_2Se_4(enH)_2(en)_y$, $In_2Se_4(enH)(N_2H_5)(en)_y$, $In_2Se_4(N_2H_5)_2(en)_y$, $In_2Se_4(enH)_2(en)_y(N_2H_4)_2$, $In_2Se_4(enH)(N_2H_5)(en)_y(N_2H_4)_2$, and/or $In_2Se_4(N_2H_5)_2(en)_y(N_2H_4)_2$. If more than one of these possibilities are present in the solution, they may be present in various proportions in equilibrium with each other. The enH is protonated en and serves the same purpose in the formulations as the protonated hydrazine, $N_2H_5$, which is to compensate the charge on the $In_2Se_4^{2-}$ core. Therefore, the enH and the $N_2H_5$ are interchangeable and can replace each other, as illustrated in the possible formulations listed above, and, in the general formula. $0 \leq x \leq 2$.

Some amount of ethylene diamine (en) is among the ligands of the possible formulations listed above, so y is always at least one, and H can be any number above one that forms in the reaction. As mentioned above, it is possible for the $In_2Se_4$-ethylene diamine complex produced by this reaction to contain only en ligands, so z can be either zero or any number above zero that forms in the reaction. Except for $y \geq 1$ and $z \geq 0$, as explained above, the values of y and z are not critical and can be any amounts that form in the reaction of $In_2Se_3$, Se, hydrazine, and ethylene diamine, because any amounts of en and $N_2H_4$ that get incorporated into the ligands will be soluble with the $In_2Se_4^{2-}$ core at least in ethylene diamine or in ethylene diamine/hydrazine mixtures, thus useable for making the In—Se and $In_2Se_3$ crystalline films, as described above.

As explained above, the precursor, $In_2Se_4(enH)_x(N_2H_5)_{2-x}(en)_y(N_2H_4)_x$, was made and used for depositing thin films of crystalline In—Se and $In_2Se_3$ with an ethylene diamine/hydrazine solution, so there was and is no need to isolate any particular $In_2Se_4$-ethylene diamine complex products from the solution or to determine specific numbers of (en) and $N_2H_4$ in a specific formulation or product of the reaction of $In_2Se_3$, Se, hydrazine, and ethylene diamine. However, such isolation can be done, if desired, and such isolated $In_2Se_4$-ethylene diamine complex products are re-soluble in ethylene diamine and/or ethylene diamine/hydrazine mixtures, and it is expected that they are also soluble in other solvents, such as, for example, DMSO.

While a number of example aspects, implementations, and embodiments have been discussed above, those of skill in the art will recognize certain modifications, permutations, additions, variations, and subcombinations thereof. It is therefore intended that the following appended claims hereafter introduced are interpreted to include all such modifications, permutations, additions, and subcombinations as are within their true spirit and scope. The words "comprise," "comprises," "comprising," "comprised," "compose," "composing," "composed," "have," "having," "include," "including," and "includes" when used in this specification and in the following claims are intended to specify the presence of stated features or steps, but they do not preclude the presence or addition of one or more other features, steps, or groups thereof.

We claim:

1. A method of forming a crystalline $Cu_2Se$ film, comprising:
   dissolving a $Cu_2Se_x$-diamine coordination compound in a liquid solvent to form a liquid $Cu_2Se_x$-diamine solution;
   depositing the $Cu_2Se_x$-diamine solution on a substrate, where $1 \le x \le 12$; and
   heating the $Cu_2Se_x$-diamine solution on the substrate to vaporize the solvent and to decompose the $Cu_2Se_x$-diamine coordination compound so that the crystalline $Cu_2Se$ film forms on the substrate.

2. The method of claim 1, including synthesizing the $Cu_2Se_x$-diamine coordination compound by reacting $Cu_2Se$ and Se with ethylene diamine.

3. The method of claim 1, including synthesizing the $Cu_2Se_x$-diamine coordination compound by reacting $Cu_2Se$ and Se with 1,3-diaminopropane.

4. The method of claim 1, including synthesizing the $Cu_2Se_x$-diamine coordination compound by reacting $Cu_2Se$ and Se with 1,2-diaminobenzene.

5. The method of claim 1, including dissolving the $Cu_2Se_x$-diamine coordination compound in DMSO.

6. The method of claim 1, including dissolving the $Cu_2Se_x$-diamine coordination compound in ethylene diamine.

7. The method of claim 1, including heating the $Cu_2Se_x$-diamine solution on the substrate to a temperature in a range of 150 to 650° C. to also vaporize ligands decomposed from the $Cu_2Se_x$ and volatile products including Se and/or $H_2Se$ so that the crystalline $Cu_2Se$ film forms on the substrate and to anneal the crystalline $C_2Se$ on the substrate.

8. The method of claim 7, including heating the $C_2S_x$-diamine solution on the substrate to a temperature in a range of 350 to 500° C. to vaporize the ligands and volatile products and to anneal the crystalline $Cu_2Se$ on the substrate.

9. A method of synthesizing a soluble Cu—Se precursor for CIS and/or CIGS film, comprising reacting $Cu_2Se$ and Se with a di-functional diamine to produce soluble $Cu_2Se_x$-diamine coordination compound.

10. The method of claim 9, wherein the di-functional diamine comprises ethylene diamine to produce soluble $Cu_2Se_x(en)_y$.

11. The method of claim 9, wherein the di-functional diamine comprises 1,3-diaminopropane.

12. The method of claim 9, wherein the di-functional diamine comprises 1,2-diaminobenzene.

13. A method of forming a crystalline In—Se film, comprising:
   dissolving $In_2Se_4(enH)_x(N_2H_5)_{2-x}(en)_y(N_2H_4)_x$ in a liquid solvent to form a liquid $In_2Se_4(enH)_x(N_2H_5)_{2-x}(en)_y(N_2H_4)_x$ solution, where $0 \le x \le 2$, $y \ge 1$, and $z \ge 0$;
   depositing the liquid $In_2Se_4(enH)_x(N_2H_5)_{2-x}(en)_y(N_2H_4)_x$ solution on a substrate; and
   heating the $In_2Se_4(enH)_x(N_2H_5)_{2-x}(en)_y(N_2H_4)_x$ on the substrate to vaporize the solvent and to decompose the $In_2Se_4(enH)_x(N_2H_5)_{2-x}(en)_y(N_2H_4)_x$ and vaporize the ligands and volatile products including Se and/or $H_2Se$ so that the crystalline In—Se film forms on the substrate.

14. The method of claim 13, including dissolving the $In_2Se_4(enH)_x(N_2H_5)_{2-x}(en)_y(N_2H_4)_x$ in a mixture of DMSO and ethanol amine.

15. The method of claim 13, including dissolving the $In_2Se_4(enH)_x(N_2H_5)_{2-x}(en)_y(N_2H_4)_x$ in a mixture of hydrazine and ethylene diamine.

16. The method of claim 13, including heating the $In_2Se_4(enH)_x(N_2H_5)_{2-x}(en)_y(N_2H_4)_x$ to a temperature in a range of 300 to 650° C. to vaporize the ligands and volatile products and to anneal the In—Se on the substrate to produce crystalline In—Se film.

17. The method of claim 13, including heating the $In_2Se_4(enH)_x(N_2H_5)_{2-x}(en)_y(N_2H_4)_x$ to a temperature in a range of 300 to 400° C. for a time in a range of two to fifteen minutes to vaporize the ligands and volatile products and to anneal the In—Se on the substrate to produce crystalline In—Se film.

18. The method of claim 13, including heating the $In_2Se_4(enH)_x(N_2H_5)_{2-x}(en)_y(N_2H_4)_x$ to a temperature in a range of 300 to 400° C. for more than fifteen minutes to vaporize the ligands and volatile products and to anneal the In—Se on the substrate to produce crystalline In—Se film.

19. The method of claim 13, including heating the $In_2Se_4(enH)_x(N_2H_5)_{2-x}(en)_y(N_2H_4)_x$ to a temperature in a range of 400 to 550° C. for a time in a range of two to fifteen minutes to vaporize the ligands and volatile products and to anneal the In—Se on the substrate to produce $\gamma$-$In_2Se_3$ film.

20. A precursor for CIS and/or CIGS film comprising soluble $In_2Se_4(enH)_x(N_2H_5)_{2-x}(en)_y(N_2H_4)_x$ where $0 \le x \le 2$, $y \ge 1$, and $z \ge 0$.

21. A method of forming a crystalline $Cu_2Se$ film, comprising:
   synthesizing a copper-organoselenide precursor;
   depositing the precursor on a substrate; and
   heating the precursor to decompose the precursor and so that crystalline $Cu_2Se$ film forms on the substrate.

22. The method of claim 21, wherein the copper-organoselenide precursor includes a copper alkyl selenide.

23. The method of claim 21, wherein the copper-organoselenide precursor includes a copper aryl selenide.

24. The method of claim 21, wherein the copper-organoselenide includes copper n-butyl selenide.

25. The method of claim 24, including synthesizing the copper n-butyl selenide by reacting n-butyl selenide with a copper(I) salt.

26. The method of claim 25, wherein the copper(I) salt includes copper(I) coordination complexes.

27. The method of claim 26, wherein the copper(I) coordination complex includes [Cu(CH$_3$CN)$_4$](PF$_6$).

28. The method of claim 25, wherein the copper(I) salt includes a copper halide.

29. The method of claim 28, wherein the copper halide includes copper iodide.

30. The method of claim 28, wherein the copper halide includes copper bromide.

31. The method of claim 28, wherein the copper halide includes copper chloride.

32. The method of claim 26, wherein the copper(I) salt includes copper(I) methoxide.

33. The method of claim 24, including synthesizing the n-butyl selenide by reacting elemental selenium with n-butyl lithium.

34. The method of claim 21, including synthesizing the copper-organoselenide by reacting an organoselenide with a copper(I) salt.

35. The method of claim 21, including synthesizing the copper-organoselenide by reacting an organometallic reagent with elemental selenium.

36. The method of claim 35, wherein the organometallic reagent includes an organolithium reagent.

37. The method of claim 36, wherein the organolithium reagent includes an alkylithium reagent.

38. The method of claim 37, wherein the alkylithium reagent includes n-butyl lithium.

39. The method of claim 37, wherein the alkylithium reagent includes t-butyl lithium.

40. The method of claim 37, wherein the alkylithium reagent includes sec-butyl lithium.

41. The method of claim 37, wherein the alkylithium reagent includes methyl lithium.

42. The method of claim 37, wherein the alkylithium reagent includes phenyl lithium.

43. The method of claim 37, wherein the alkylithium reagent includes tolyl lithium.

44. The method of claim 37, wherein the alkylithium reagent includes xylyl lithium.

45. The method of claim 37, wherein the alkylithium reagent includes 2,6-diisopropylphenyl lithium.

46. The method of claim 24, including suspending the copper n-butyl selenide in a liquid for dispersing the copper n-butyl selenide on the substrate.

47. The method of claim 46, wherein the liquid is a mixture that includes a solvent and a dispersant.

48. The method of claim 47, wherein the solvent includes DMSO.

49. The method of claim 47, wherein the solvent includes ethylene diamine.

50. The method of claim 48, wherein the dispersant includes ethanolamine.

51. A precursor for producing Cu$_2$Se comprising a copper-organoselenide in a liquid solution.

52. The precursor of claim 51, wherein the copper-organoselenide includes a copper alkyl selenide.

53. The precursor of claim 52, wherein the copper alkyl selenide includes copper n-butyl selenide.

54. The precursor of claim 51, wherein the copper-organoselenide includes a copper aryl selenide.

55. A method of producing a crystalline In—Se film, comprising:
   forming a slurry of In$_2$Se$_3$ nanoparticles;
   spreading the slurry of In$_2$Se$_3$ nanoparticles on a substrate; and
   heating the slurry of In$_2$Se$_3$ nanoparticles to evaporate carrier components of the slurry and to form the crystalline In—Se film.

56. The method of claims 55, including heating the slurry of In$_2$Se$_3$ nanoparticles to a temperature in a range of 300 to 650° C. to anneal the In$_2$Se$_3$ nanoparticles to produce the In—Se film.

57. The method of claims 55, including heating the slurry of In$_2$Se$_3$ nanoparticles to a temperature in a range of 300 to 400° C. to anneal the In$_2$Se$_3$ nanoparticles to produce crystalline InSe.

58. The method of claims 55, including heating the slurry of In$_2$Se$_3$ nanoparticles to a temperature in a range of 300 to 400° C. to anneal the In$_2$Se$_3$ nanoparticles to produce γ-In$_2$Se$_3$.

59. The method of claim 55, including producing the In$_2$Se$_3$ nanoparticles by reacting indium iodide with sodium selenide in methanol.

60. A method of forming a crystalline In—Se film, comprising:
   reacting In$_2$Se$_3$, elemental Se, hydrazine, and ethylene diamine to form a liquid solution comprising In$_2$Se$_4$(enH)$_x$(N$_2$H$_5$)$_{2-x}$(en)$_y$(N$_2$H$_4$)$_x$, where 0≤x≤2, y≥1, and z≥0;
   depositing the liquid solution comprising the In$_2$Se$_4$(enH)$_x$(N$_2$H$_5$)$_{2-x}$(en)$_y$(N$_2$H$_4$)$_x$ on a substrate; and
   heating the solution comprising the In$_2$Se$_4$(enH)$_x$(N$_2$H$_5$)$_{2-x}$(en)$_y$(N$_2$H$_4$)$_x$ on the substrate to vaporize the solvent and to decompose the In$_2$Se$_4$(enH)$_x$(N$_2$H$_5$)$_{2-x}$(en)$_y$(N$_2$H$_4$)$_x$ and vaporize the ligands and volatile products including Se and/or H$_2$Se so that the crystalline In—Se film forms on the substrate.

61. The method of claim 60, including heating the solution comprising the In$_2$Se$_4$(enH)$_x$(N$_2$H$_5$)$_{2-x}$(en)$_y$(N$_2$H$_4$)$_x$ on the substrate to a temperature in a range of 300 to 400° C. to vaporize the solvent and to decompose the In$_2$Se$_4$(enH)$_x$(N$_2$H$_5$)$_{2-x}$(en)$_y$(N$_2$H$_4$)$_x$ and vaporize the ligands and volatile products including Se and/or H$_2$Se so that crystalline In—Se film forms on the substrate.

62. The method of claim 60, including heating the solution comprising the In$_2$Se$_4$(enH)$_x$(N$_2$H$_5$)$_{2-x}$(en)$_y$(N$_2$H$_4$)$_x$ on the substrate to a temperature in a range of 400 to 650° C. to vaporize the solvent and to decompose the In$_2$Se$_4$(enH)$_x$(N$_2$H$_5$)$_{2-x}$(en)$_y$(N$_2$H$_4$)$_x$ and vaporize the ligands and volatile products including Se and/or H$_2$Se so that crystalline γ-In$_2$Se$_3$ film forms on the substrate.

* * * * *